United States Patent [19]

Hong

[11] Patent Number: 5,358,887
[45] Date of Patent: Oct. 25, 1994

[54] ULSI MASK ROM STRUCTURE AND METHOD OF MANUFACTURE

[75] Inventor: Gary Hong, Hsinchu, Taiwan

[73] Assignee: United Microelectronics Corporation, Hsinchu, Taiwan

[21] Appl. No.: 157,402

[22] Filed: Nov. 26, 1993

[51] Int. Cl.⁵ .............................. A01L 21/70
[52] U.S. Cl. .................... 437/48; 437/45; 437/46; 437/52; 437/915
[58] Field of Search ........... 437/45, 46, 48, 52; 365/103; 257/390, 391

[56] References Cited

U.S. PATENT DOCUMENTS

| | | | |
|---|---|---|---|
| 4,272,880 | 7/1981 | Pashley | 437/915 |
| 4,467,518 | 8/1984 | Bamsal et al. | 437/915 |
| 4,555,843 | 12/1985 | Malhi | 437/915 |
| 4,630,089 | 4/1986 | Sasaki et al. | 257/391 |
| 4,656,731 | 4/1987 | Lam et al. | 437/915 |
| 4,971,925 | 11/1990 | Alexander et al. | 437/915 |
| 5,266,507 | 11/1993 | Wu | 437/915 |

*Primary Examiner*—Tom Thomas
*Attorney, Agent, or Firm*—George O. Saile; Graham S. Jones, Jr.

[57] ABSTRACT

A ROM device provides a double density memory array. The word line array is composed of transversely disposed conductors sandwiched between two arrays of bit lines which are orthogonally disposed relative to the word line array. The two arrays of bit lines are stacked with one above and with one below the word line array. A first gate oxide layer is located between the word line array and a first one of the array of bit lines and a second gate oxide layer is located between the word line array and a the other of the arrays of bit lines. The two parallel sets of polysilicon thin film transistors are formed with the word lines serving as gates for the transistors.

8 Claims, 8 Drawing Sheets

ULSI MASK ROM STRUCTURE AND METHOD OF MANUFACTURE

BACKGROUND OF THE INVENTION

1. Field of the Invention

This invention relates to Read Only Memory (ROM) devices, and more particularly to improved structural arrangements thereof, and to methods of manufacture thereof.

2. Description of Related Art

ROM devices are standard components of modern computer systems. A ROM comprises an array of Metal Oxide Semiconductor Field Effect Transistor (MOSFET's) arranged in columns and rows, wherein predetermined MOSFET's are either permanently conductive or nonconductive as a function of the variety of transistor. The alternative on/off operation with changes in the states of operation of the MOSFETs is adapted to use for storage of data, which remains in the device when the external power supply is off.

A ROM device includes an array of parallel, closely spaced lines regions formed of a heavily doped impurity in a semiconductor substrate having an opposite type of background impurity. On the surface of the substrate an insulating layer is formed thereon. Another array of closely spaced conductive lines formed on the surface of the insulating layer is arranged at right angles to the spaced lines in the substrate. Insulating layers are formed on the upper array of conductive lines. A metallurgy layer connects the two arrays of lines to circuits to address the lines and to read the data stored in the ROM, as is well known in the art.

At the intersection of a conductive line in the upper array which is commonly referred to in most cases as a "word line" and a pair of adjacent lines in the substrate, known in most cases as the "bit lines", a MOSFET is formed. The spaced lines in the substrate comprise the source and drain of the MOSFET. The conductive word line serves as the gate electrode of the MOSFET. Certain predetermined MOSFET's can be made permanently non-conductive (turned off).

A problem with the trend in the semiconductor industry is the ever increasing density of circuits on a device. Accordingly, an object of this invention is to provide an improved design for a very high density ROM device.

Another objective ever desirable in electronic devices and other technologies is the simplification of the structure and operation of devices. In the case of the very large number of circuits in the state of the art ROMs the need for simplification of structure and operation is as desirable as ever. Accordingly, it is an important object of this invention is to provide for simplification of the structure and the operation of ROM devices.

SUMMARY OF THE INVENTION

This invention has a first advantage that the problem of density of circuits on a ROM device is resolved by the use of a combination of N-channel and P-channel transistors cells stacked together.

Another advantage of this invention is that the structure and the operation of ROM devices is simplified in terms of structure and operation by the improvement of employing a common word line.

In accordance with this invention, a ROM device provides a double density memory array comprising a word line array composed of transversely disposed conductors, the word line array being sandwiched between two arrays of bit lines which are orthogonally disposed relative to the word line array, with the two arrays of bit lines being stacked with one above and with one below the word line array.

Preferably, a first gate oxide layer is located between the word line array and a first one of the arrays of bit lines and a second gate oxide layer is located between the word line array and a the other of the arrays of bit lines, and two parallel sets of polysilicon thin film transistors are formed with the word lines serving as gates for the transistors.

Preferably, a word line and a line for the drain and a line for the source are provided, with selector transistors having gates the voltage parameters thereof comprise

| | |
|---|---|
| Word line | = 5 Volts |
| Gates of selector transistors T2 and T3 | = 5 Volts |
| Line L1 | = 2 Volts |
| Line L2 | = Ground. |

It is preferred that a word line and line for the drain and a line for the source are provided, with selector transistors having gates the voltage parameters thereof comprise

| | |
|---|---|
| Word line | = 0 Volts |
| Gates of selector transistors T5 and T6 | = 0 Volts |
| Line L7 | = 3 Volts |
| Line L8 | = 5 Volts. |

In accordance with this invention, a ROM device on a substrate is manufactured by the method comprising a) forming a field oxide layer on the substrate, b) forming a first bit line layer comprising a bit line material on the field oxide layer, c) doping the first bit line layer with a bit line impurity, d) masking the first bit line layer with a source/drain mask, e) employing ion implantation of source/drain regions in the first bit line layer through the source/drain mask, f) stripping the source/drain mask, g) forming a gate oxide on the first bit line layer, h) forming a word line layer comprising a word line material on the gate oxide layer, i) doping the word line layer with a word line impurity, j) masking the word line layer with a word line mask, k) etching the word line layer through the word line mask, l) stripping the word line mask, m) forming a first ROM code mask, n) implanting a first ROM code through the ROM code mask into the first bit line layer, and stripping the ROM code mask, o) forming a second gate oxide layer on the word line layer, p) forming a second bit line layer comprising a bit line material on the field oxide layer, q) doping the second bit line layer with a second bit line impurity, r) masking the second bit line layer with a second source/drain mask, s) employing ion implantation of source/drain regions in the second bit line layer through the second source/drain mask, and stripping the second source/drain mask, t) forming a second ROM code mask, and u) implanting a second ROM code through the second ROM code mask into the second bit line layer, and stripping the second ROM code mask.

Preferably, the first bit line layer is doped N− with a dose of from about $1 \times 10^{11}/cm^2$ to about $1 \times 10^{13}/cm^2$, at an energy of from about 20 keV to about 100 keV, the ion implantation of source/drain regions comprises doping N+ with a dose of from about $1 \times 10^{15}/cm^2$ to about $8 \times 10^{15}/cm^2$, at an energy of from about 20 keV to about 60 keV, the first ROM code line layer is doped with an N dose of from about $5 \times 10^{13}/cm^2$ to about $8 \times 10^{14}/cm^2$, at an energy of from about 40 keV to about 80 keV, the ion implantation of source/drain regions in the second bit line layer through the second source/drain mask comprises doping N+ with a dose of from about $1 \times 10^{15}/cm^2$ to about $5 \times 10^{15}/cm^2$, at an energy of from about 30 keV to about 80 keV; the second ROM code mask is employed for implanting an P− ROM code 2 with a dose of from about $5 \times 10^{13}/cm^2$ to about $8 \times 10^{14}/cm^2$, at an energy of from about 20 keV to about 60 keV, and the substrate comprises silicon.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
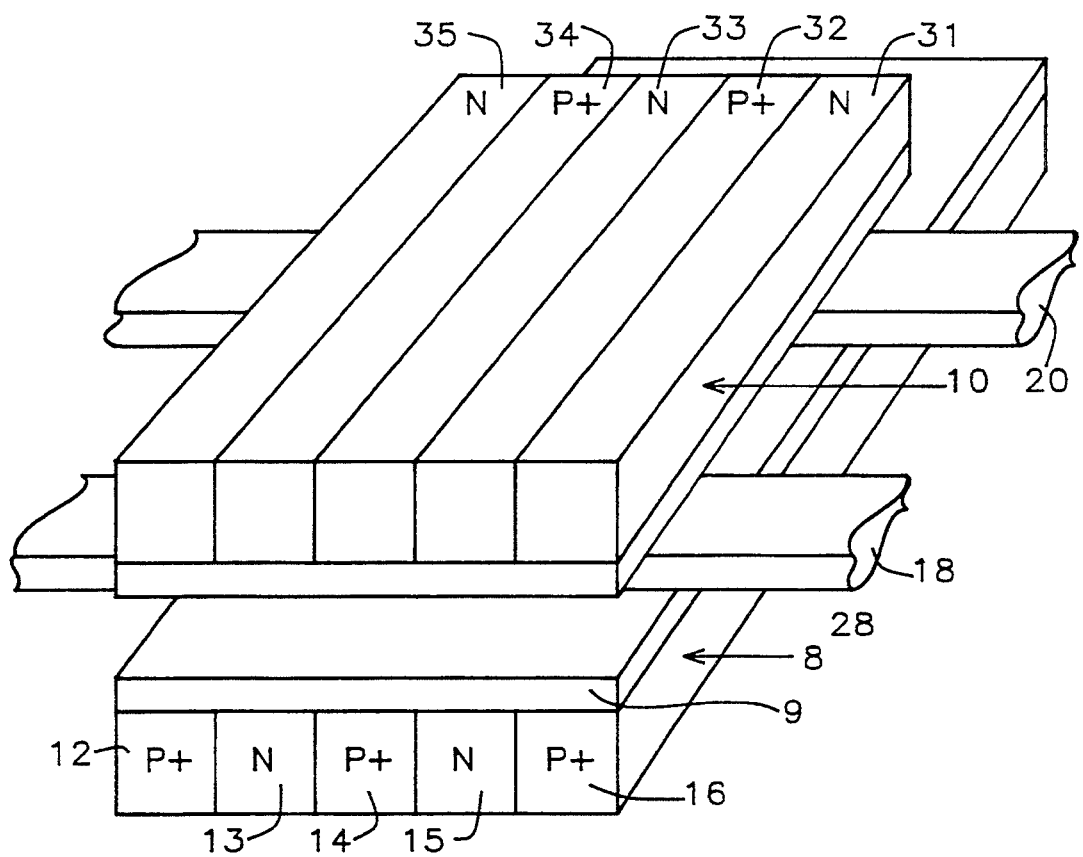
FIG. 1 shows a perspective view of a ROM structure providing a double density memory array by sandwiching one word line array composed of transversely disposed conductors between two arrays of bit lines which are orthogonally disposed relative to the word line array.

FIG. 1 shows a perspective view of a ROM structure 10 providing a double density memory array by sandwiching one word line array composed of transversely disposed conductors 18, 20, etc. between two arrays of bit lines which are orthogonally disposed relative to the word line array. The two bit line arrays are stacked with one above and with one below the word line array. Thus, the first bit line array 8 is located under the word line array 18, 20, etc. Whereas the second bit line array 30 is located above the word line array 18, 20, etc.

The portion of the first bit line array 8 shown includes alternating bit lines 12 (P+), 14 (P+), and 16(P+) and channel lines 13 (N) and 15(N). Only this portion of one array is shown for convenience of illustration. Above the first bit line array 8 is located a gate oxide layer 9.

The word lines 18 and 20 comprising N+doped polysilicon are shown extending transversely, perpendicular to the first bit line array 8 above gate oxide layer 9.

Above the word lines 18 and 20 is a second gate oxide layer 26 upon which second bit line structure 30 is formed in layer 28.

Figure 2:
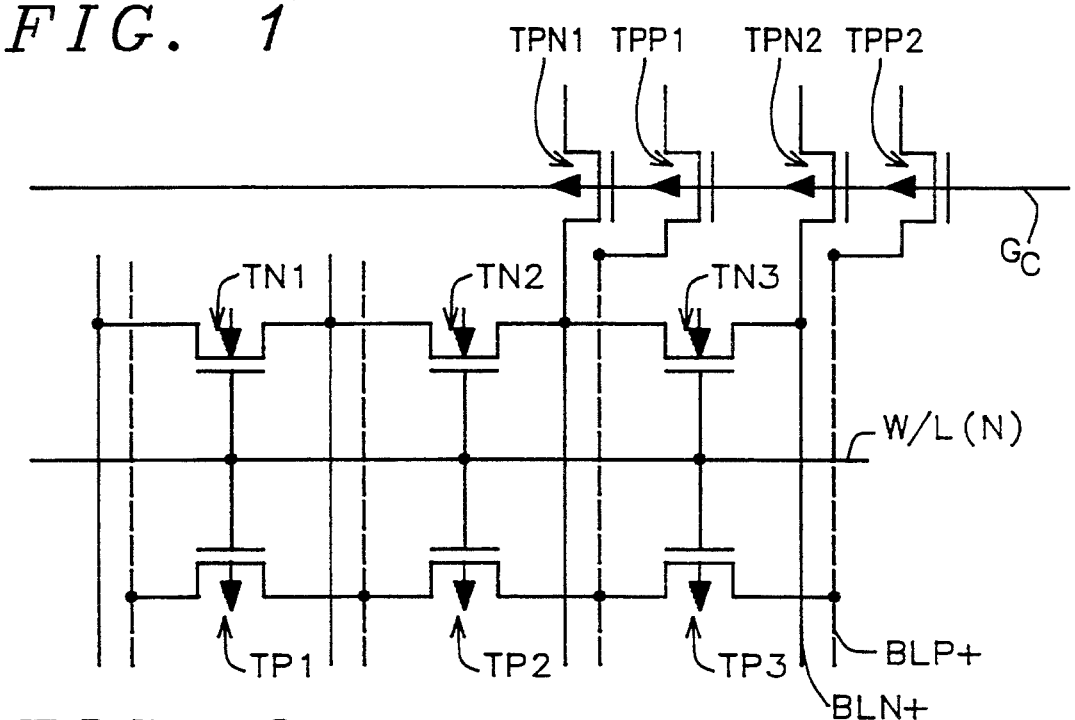
FIG. 2 is a schematic circuit diagram of the device of FIG. 1.

The resultant structure comprises two parallel sets of polysilicon thin film transistors. As shown in part in FIG. 1 and from another point of view in FIG. 2, which is a schematic circuit diagram of the device of FIG. 1, the N+ polysilicon word lines 18, 20 and W/L(N) and the top polysilicon thin film transistors form N-channel TFT memory array of transistors TN1, TN2 and TN3. The same polysilicon word lines 18, 20 and W/L(N) and the bottom polysilicon thin film transistors form P-channel TFT memory array of transistors TP1, TP2 and TP3 as shown in FIG. 2.

For sensing an N-channel memory cell of word line W/L(N) both the word line and the gate of selected transistors need to be high (say $V_{cc}$). The remainder of the word lines other than word line W/L(N) in the array (1, . . . , N−1, N+1, etc, . . . ) are low (0 Volts.) A P-channel memory cell current will not be sensed since the selector gate for the P-channel pass transistor is high, which disconnects the current flow of any P-channel cell. To sense the P-channel memory cell, put word line W/L (N) low (0 Volts) and put 0 voltage on the gate of the select transistor.

In accordance with this invention the common word line W/L is provided for both n-channel and p-channel memory cells, the n-channel and p-channel cells are alternately sensed depending on the voltage of the word line W/L and of the gate of the select transistor, which represents significant simplification of the structure for sensing the state of the cells. Because of the reduction in structure with the sharing of the single word line W/L, the operation of the system is greatly simplified.

Figure 3:
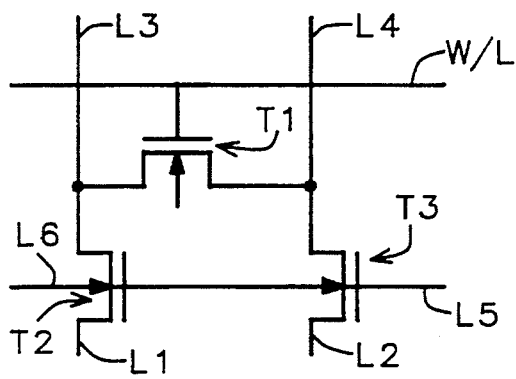
FIG. 3 is an N-channel schematic circuit diagram of a circuit in accordance with this invention.

Referring to FIG. 3, which is a schematic circuit diagram of a circuit in accordance with this invention, T1 is an N-channel transistor having its gate connected to the word line W/L, with its S/D lines L3 and L4 connected to the S/D terminals of N-channel select transistors T2 and T3 which are connected at the opposite terminals to lines L1 and L2. The gates of transistors T2 and T3 are connected to lines L5 and L6. The N-channel memory cell T1 is being sensed.

The parameters of FIG. 3, as an example are as follows:

| | |
|---|---|
| Word line (W/L) | = 5 Volts |
| Gates of selector transistors T2 and T3 | = 5 Volts |
| Line L1 (Drain) | = 2 Volts |
| Line L2 (Source) | = Ground |

Figure 4:
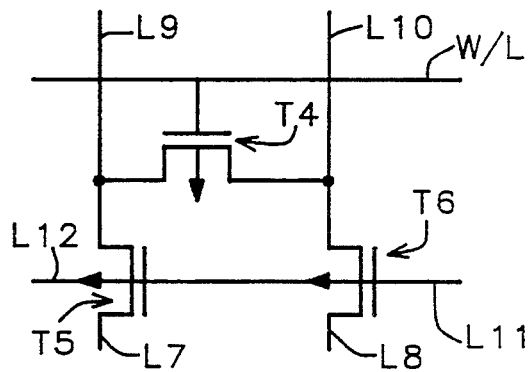
FIG. 4 is a P-channel schematic circuit diagram of a circuit in accordance with this invention.

Referring to FIG. 4, T4 is a P-channel transistor having its gate connected to the word line W/L, with its S/D lines L9 and L10 connected to the S/D of P-channel select transistors T5 and T6 which are connected at the opposite terminals to lines L7 and L8. The gates of transistors T5 and T6 are connected to lines L11 and L12. The P-channel memory cell T4 is being sensed.

The parameters of FIG. 4., as an example are as follows:

| | |
|---|---|
| Word line (W/L) | = 0 Volts |
| Gates of selector transistors T5 and T6 | = 0 Volts |
| Line L7 (Drain) | = 3 Volts |
| Line L8 (Source) | = 5 Volts |

The preferred process of fabrication of a device in accordance with this invention is shown from FIG. 5 to FIG. 17.

Figure 5:
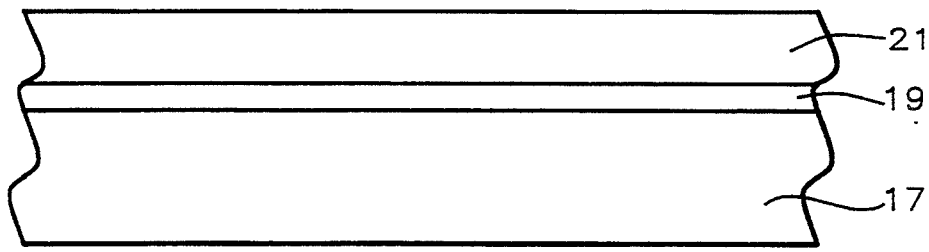
FIGS. 5 to 17 are sectional view of the preferred process of fabrication a device in of a device in accordance with this invention.

Referring to FIG. 5, a silicon substrate 17 has a field oxide layer 19 formed thereon. A polysilicon layer 21 is formed on the field oxide layer 19.

Polysilicon layer 21 is formed to a thickness of from about 500 Å to about 5,000 Å using a conventional method, such as LPCVD.

Figure 6:
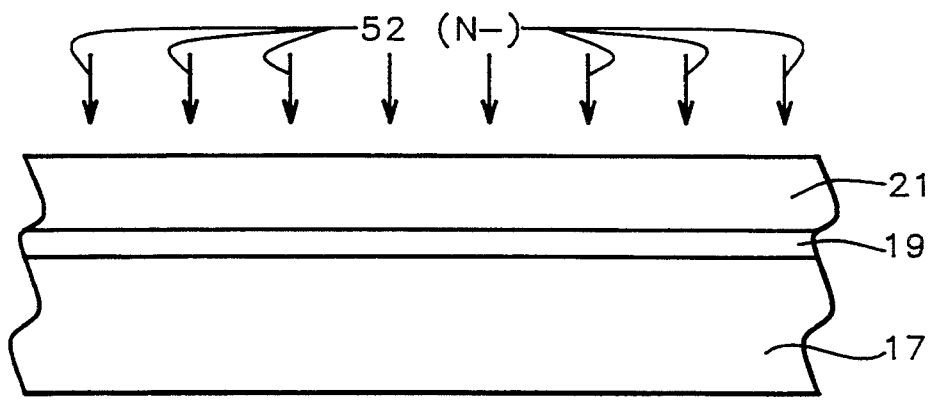

Then in FIG. 6, the entire polysilicon layer 21 is doped N- by ion implantation by ions 52. The preferred chemical species of the dopant 52 implanted is arsenic with a dose of from about $1.0 \times 10^{11}/cm^2$ to about $1.0 \times 10^{13}/cm^2$, at an energy of from about 20 keV to about 100 keV.

Figure 7:
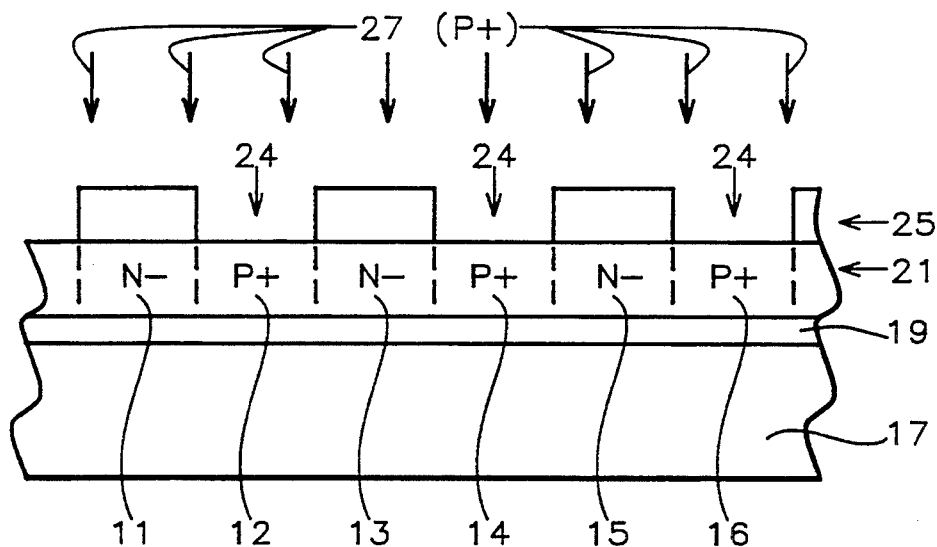

In FIG. 7, the polysilicon layer 21 has been coated with a S/D (source/drain, P— channel) photoresist layer 25 which has been patterned into a mask with openings 24. Through the openings 24, P+dopant is implanted to form the S/D P-channel structures.

In an S/D implant, these sections of layer 21 are doped P+ by ion implantation by ions 27. The preferred chemical species of the dopant 27 implanted is boron with a dose of from about $1.0 \times 10^{15}/cm^2$ to about $8.0 \times 10^{15}/cm^2$, at an energy of from about 20 keV to about 60 keV. The P+ regions, (alternating bit lines) 12, 14 and 16 have been formed in the N layer 21, with alternating N regions 11, 13, and 15, which will be channel regions, as will be better understood by reference to FIG. 1.

Next, the photoresist layer 25 is stripped from the structure of FIG. 7.

Figure 8:
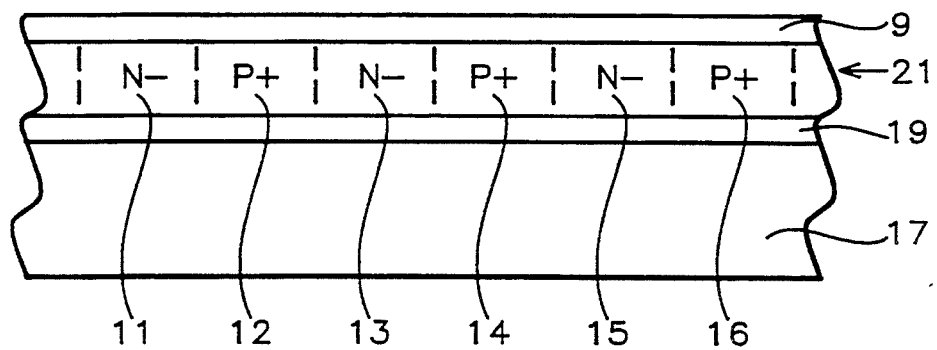

In FIG. 8, the product of FIG. 7 is shown after the photoresist layer 25 has been removed in preparation for the application of gate oxide layer 9 on top of polysilicon layer 21. The gate oxide layer 9 is preferably formed by thermal oxidation to a thickness of from about 80 Å to about 150 Å.

Figure 9:
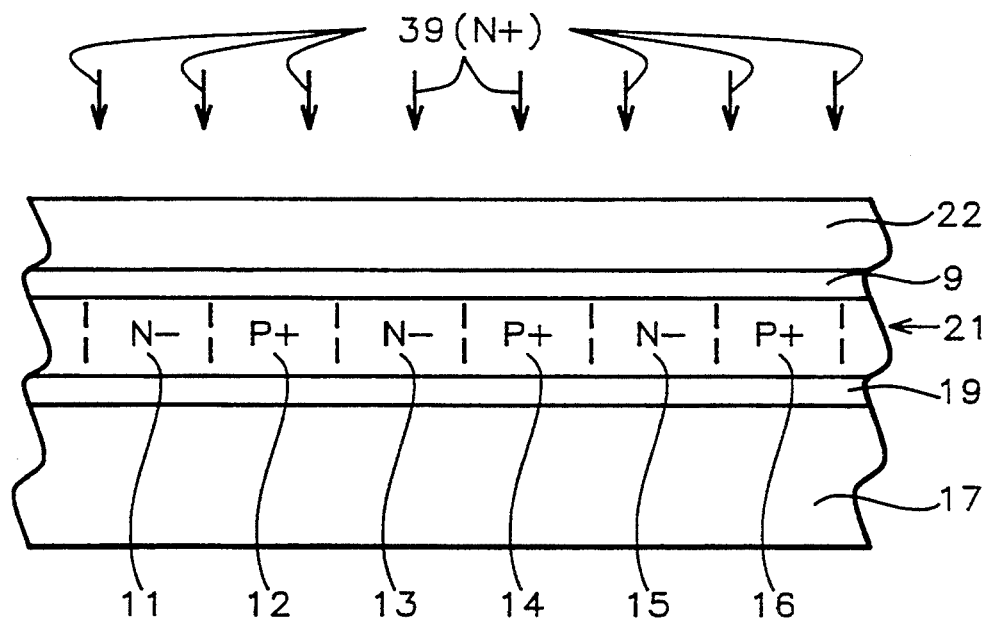

FIG. 9 shows the product of FIG. 8 with a polysilicon 2 layer 22 formed upon gate oxide layer 9 having a thickness of from about 2,000 Å to about 5,000 Å. Layer 22 is formed using a conventional method such as LPCVD.

Next, in FIG. 9 a step of blanket ion implantation of N+ ions 38 follows the deposition of the layer 22. The preferred chemical species of the dopant 39 implanted is arsenic (As) with a dose of from about $5.0 \times 10^{16}/cm^2$ to about $5.0 \times 10^{16}/cm^2$, at an energy of from about 30 keV to about 80 keV.

Figure 10:
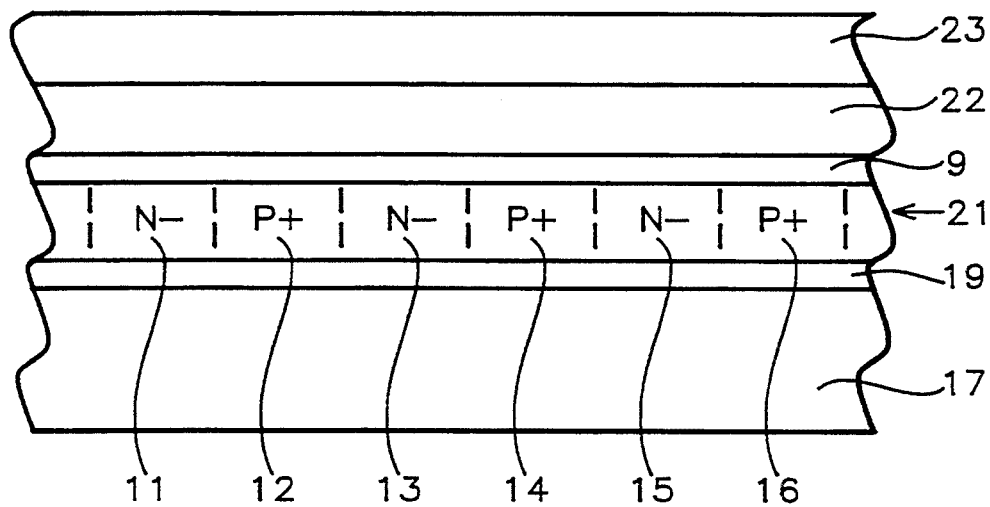

In the next step, in FIG. 10, a layer of photoresist 23 has been deposited upon the polysilicon 2 layer 21, which is then exposed to a lithographic pattern of illumination to form a mask, which is then developed. Then word lines are etched in the conventional manner and the mask 23 is removed by a conventional resist stripping process.

Figure 11:
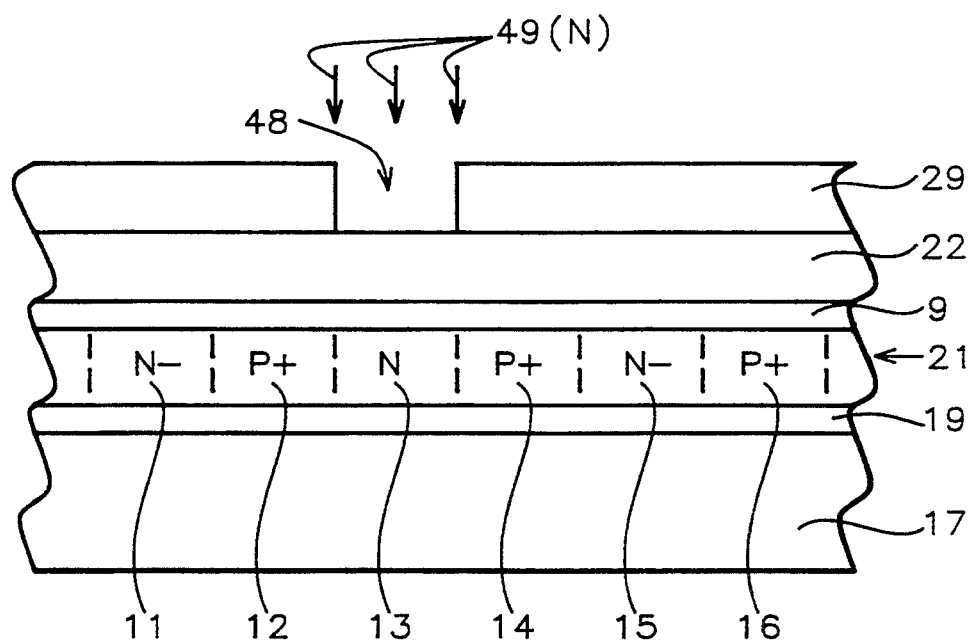

The next procedure shown in FIG. 11 is application of a photolithographic mask layer 29 which has been exposed and developed forming an ROM code # mask as exemplified by opening 48 therethrough. The ROM code # 1 is formed by an N type dose implant of ions 49 into polysilicon 21. The implanted N dose will increase the N— channel doping in region 13 to a heavier N type or N+ type doping level. The heavier doping level produced, creating an N region or an N+ region, turns the P-channel transition off permanently.

The preferred chemical species of the dopant 49 implanted is arsenic (As) with a dose of from about $5 \times 10^{13}/cm^2$ to about $8 \times 10^{14}/cm^2$, at an energy of from about 40 keV to about 80 keV. With a heavier N type implant, the channel region 13 becomes N (1 E16 to 1E18) or N+(1E17 to 1E20) atom/$cm^3$.

Then the resist layer 29 is removed by a conventional resist stripping process.

Figure 12:
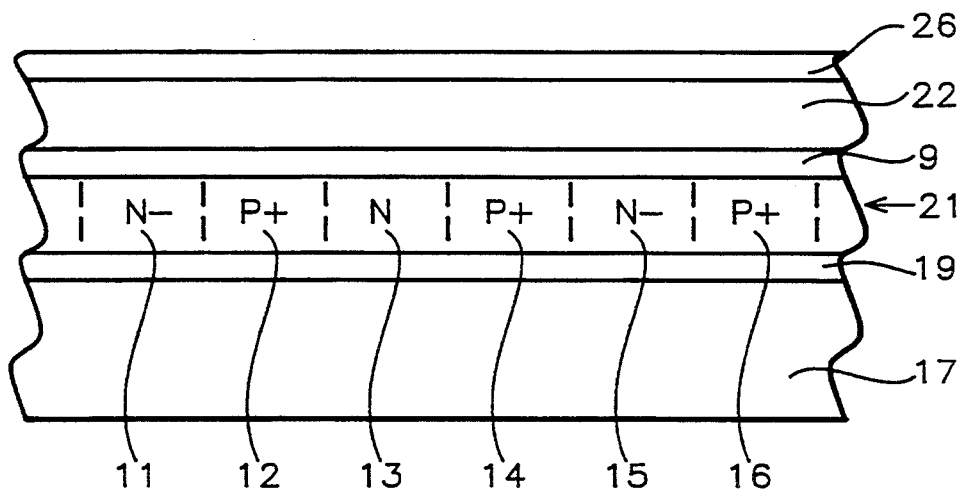

In FIG. 12, another gate oxide layer 26 has been formed.

Figure 13:
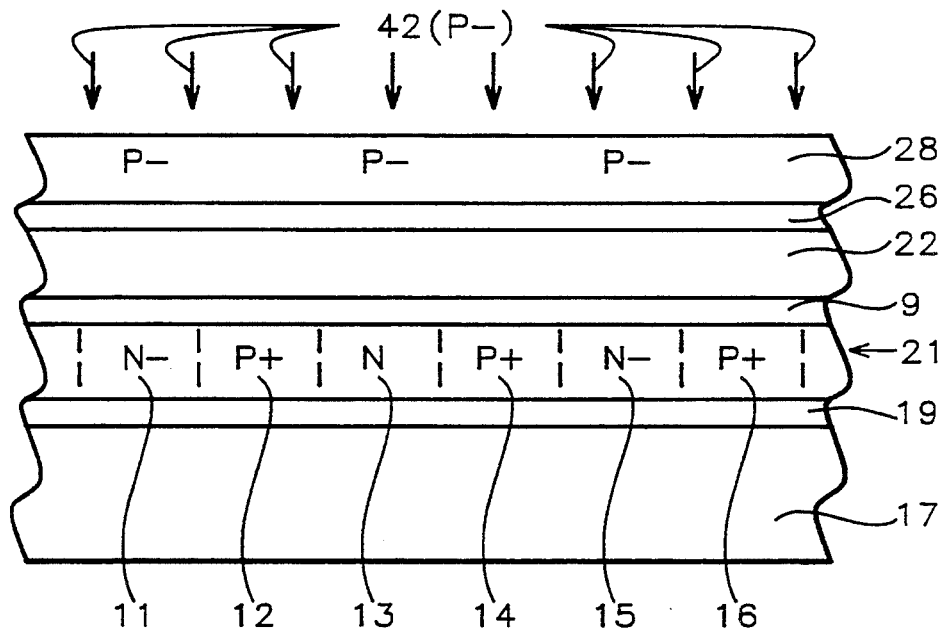

In FIG. 13, a polysilicon 3 layer 28 has been deposited upon the gate oxide layer 26 having a thickness of from about 500 Å to about 5,000 Å. Layer 28 is formed using a conventional method such as LPCVD.

Continuing with the process, a blanket P— doping 42 is applied to the layer 28. The preferred chemical species of the dopant 42 implanted is boron with a dose of from about $1 \times 10^{11}/cm^2$ to about $1 \times 10^{13}/cm^2$, at an energy of from about 20 keV to about 50 keV.

Figure 14:
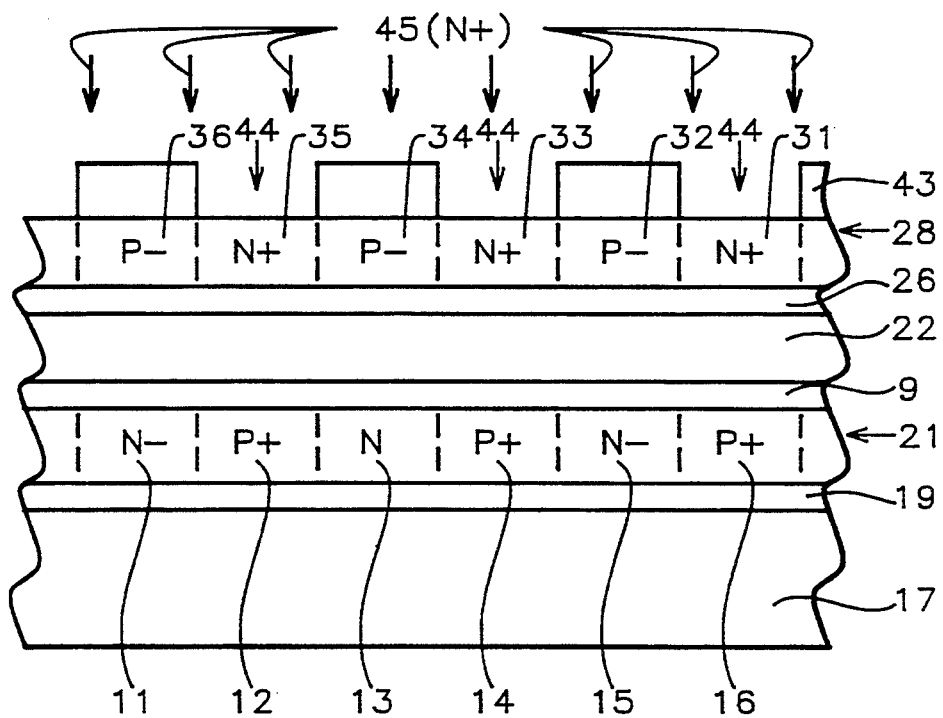

In FIG. 14, an N+source/drain (S/D) channel mask of photoresist 43 has been formed with openings 44 exposing alternating bit line regions 31, 33 and 35 into which N+ ions 45 are implanted.

The preferred chemical species of the dopant 45 implanted is arsenic with a dose of from between about $1 \times 10^{15}/cm^2$ to about $5 \times 10^{15}/cm^2$, at an energy of from about 30 keV to about 80 keV.

Figure 15:
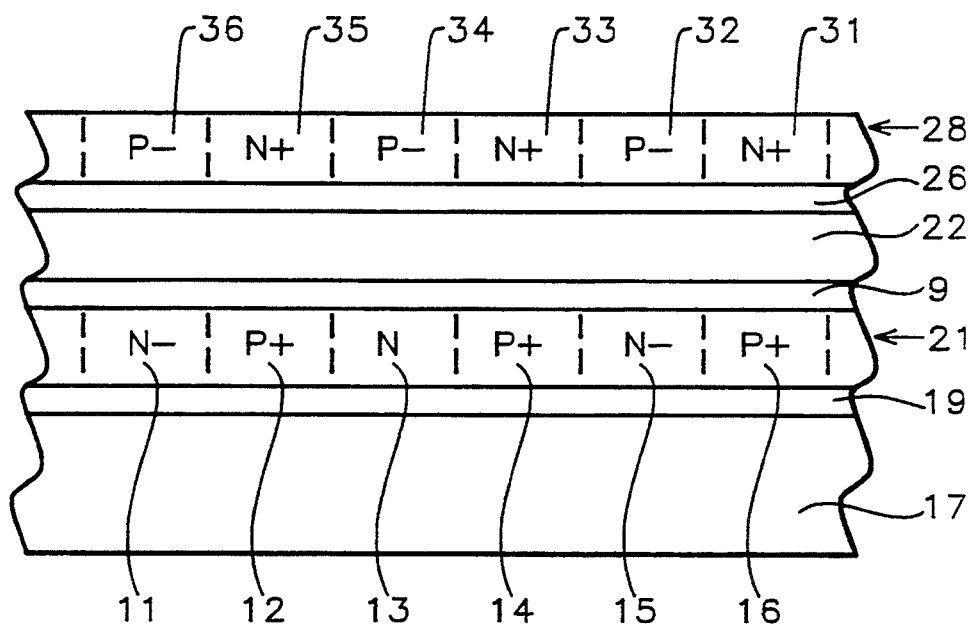

In FIG. 15, resist mask 43 has been stripped by a resist stripping process. The polysilicon 3 layer 28 is shown with the newly formed N+bit line regions 31, 33, and 35 separated by P channel regions 32, 34, and 36 therein.

Figure 16:
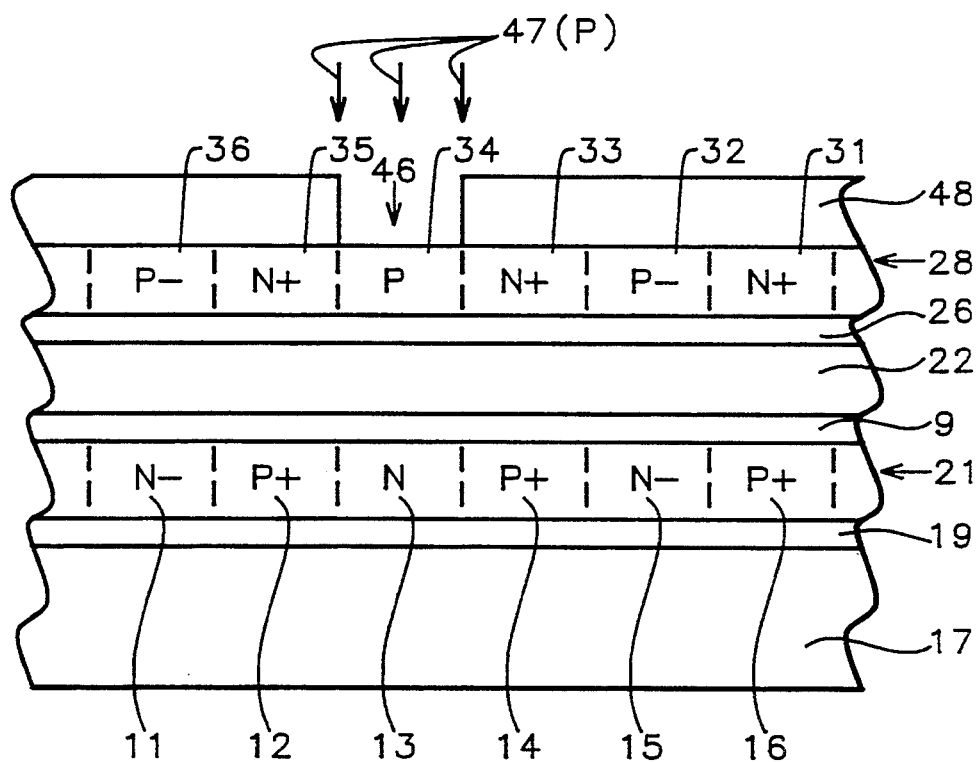

In FIG. 16, a layer 48 of resist has been applied to the layer 28 and it is formed into a ROM code #2 mask by the conventional photolithographic process. An opening 46 has been made for the purpose of making a P implant. The preferred chemical species of the dopant 25 implanted is boron with a dose of from about $5 \times 10^{13}/cm^2$ to about $8 \times 10^{14}/cm^2$, at an energy of from about 20 keV to about 60 keV. The implanted boron (ROM code) serves the function of doping the channel of the N channel transistor cell more heavily (P or P+) which high level of doping turns off the transistor permanently. As referred to above, P is within the range (1E16 to about 1E18) P+ (1E17 to about 1E20) atoms/$cm^3$. The implanted P dose will increase the P-channel doping in region 34 to a heavier P type or P+ type doping level. The heavier doping level produced, creating an P region or an P+ region, turns the N-channel transition off permanently.

Figure 17:
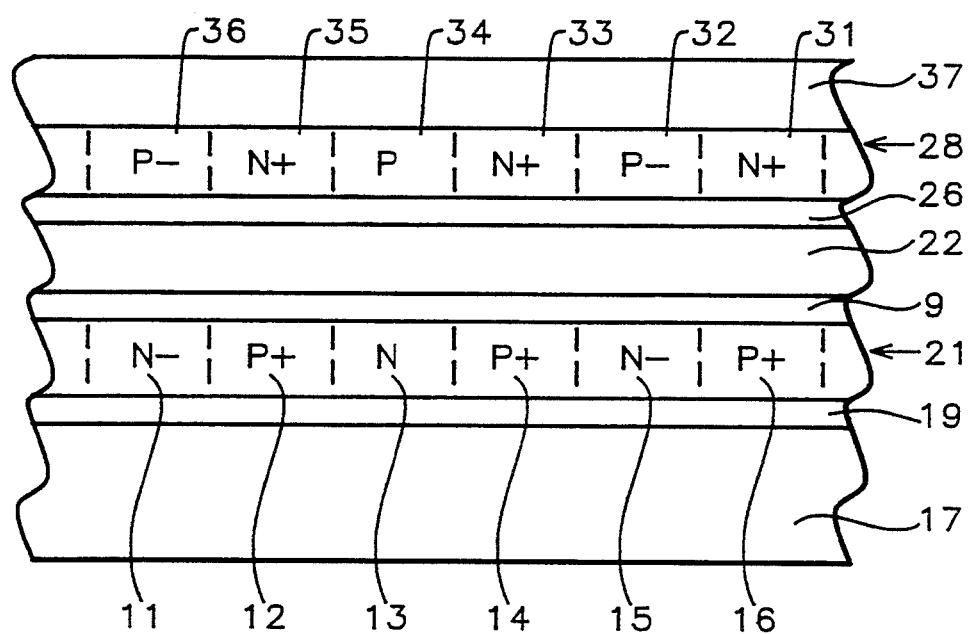

FIG. 17 shows the device of FIG. 16 after the photoresist 48 has been removed by a resist stripper, and a layer of BPSG has been applied. Afterwards, contact-/metal/passivation processes are performed and alloying is performed as is well known to those skilled in the art.

Note that the first polysilicon which formed the P-channel body in the above process can be replaced by a silicon substrate (buried bit line structure.) The polysilicon word line W/L can also be replaced by polycide. For instance, tungsten polycide can be employed.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacture of a ROM structure on a substrate, said method comprising
   a) forming a field oxide layer on said substrate,
   b) forming a first polysilicon layer on said field oxide layer and said substrate,
   c) doping said first polysilicon layer with a dopant having a first conductivity type,
   d) making said first polysilicon layer with a source/drain mask,
   e) ion implanting a dopant having a second conductivity type into source/drain regions in said first polysilicon layer through said source/drain mask,
   f) stripping said source/drain mask,
   g) forming a gate oxide on said first polysilicon layer,
   h) forming a second polysilicon layer on said gate oxide layer,
   i) doping said second polysilicon layer with a dopant of the first conductivity type,
   j) masking said second polysilicon layer with a word line mask,
   k) etching said second polysilicon through said work line mask,
   l) stripping said work line mask,
   m) forming a first ROM code mask,
   n) ion implanting a dopant having the first conductivity type to form a first ROM code region through said ROM code mask into said first polysilicon layer, and stripping said ROM code mask,
   o) forming a second gate oxide layer on said second polysilicon layer,
   p) forming a third polysilicon layer on said second gate oxide layer,
   q) doping said third polysilicon layer with a dopants having the second conductivity type,
   r) masking said third polysilicon layer with a second source/drain mask,
   s) ion implanting dopants of the first conductivity type into said second source/drain regions in said third polysilicon layer through said second source/drain mask, and stripping said second source/drain mask,
   t) forming a second ROM code mask, on said third polysilicon layer and
   u) ion implanting dopants of the second conductivity type to form a second ROM code region through said second ROM codemask into said third polysilicon layer, and stripping said second ROM code mask.

2. A method in accordance with claim 1 wherein said first polysilicon layer is doped N− with a dose of from about $1 \times 10^{11}/cm^2$ to about $1 \times 10^{13}/cm^2$, at an energy of from about 20 keV to about 100 keV.

3. A method in accordance with claim 1 wherein said ion implantation of source/drain regions in said first polysilicon layer comprises doping N+ with a dose of from about $1 \times 10^{15}/cm^2$ to about $8 \times 10^{15}/cm^2$, at an energy of from about 20 keV to about 60 keV.

4. A method in accordance with claim 1 wherein said first ROM code region is doped with an N dose of from about $5 \times 10^{13}/cm^2$ to about $8 \times 10^{14}/cm^2$, at an energy of from about 40 keV to about 80 keV.

5. A method in accordance with claim 1 wherein said ion implantation of source/drain regions in said third polysilicon through said second source/drain mask comprises doping N+ with a dose of from about $1 \times 10^{15}/cm^2$ to about $5 \times 10^{15}/cm^2$, at an energy of from about 30 keV to about 80 keV.

6. A method in accordance with claim 1 wherein said second ROM code mask is employed for implanting a p-type dopant with a dose of from about $5 \times 10^{13}/cm^2$ to about $8 \times 10^{14}/cm^2$, at an energy of from about 20 keV to about 60 keV.

7. A method in accordance with claim 1 wherein said substrate comprises silicon.

8. A method in accordance with claim 6 wherein said ROM code 2 dopant comprises boron.

* * * * *